United States Patent
Sekiguchi

(10) Patent No.: US 9,019,025 B2
(45) Date of Patent: Apr. 28, 2015

(54) OSCILLATOR

(71) Applicant: Canon Kabushiki Kaisha, Tokyo (JP)

(72) Inventor: Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 23 days.

(21) Appl. No.: 13/893,764

(22) Filed: May 14, 2013

(65) Prior Publication Data

US 2013/0328635 A1     Dec. 12, 2013

(30) Foreign Application Priority Data

Jun. 6, 2012   (JP) ................... 2012-128509

(51) Int. Cl.
*H03B 7/14*   (2006.01)
*H03B 5/30*   (2006.01)

(52) U.S. Cl.
CPC .. *H03B 5/30* (2013.01); *H03B 7/14* (2013.01); *H03B 2200/0032* (2013.01); *H03B 2200/0084* (2013.01)

(58) Field of Classification Search
USPC .................................. 331/107 T, 107 G, 105
See application file for complete search history.

(56) References Cited

U.S. PATENT DOCUMENTS

| | | | |
|---|---|---|---|
| 7,386,024 B2 | 6/2008 | Sekiguchi et al. | |
| 7,463,104 B2 | 12/2008 | Sekiguchi et al. | |
| 7,684,455 B2 | 3/2010 | Ouchi et al. | |
| 7,709,797 B2 | 5/2010 | Sekiguchi et al. | |
| 7,869,036 B2 | 1/2011 | Kajiki et al. | |
| 7,889,015 B2 | 2/2011 | Sekiguchi et al. | |
| 7,924,107 B2 | 4/2011 | Koyama et al. | |
| 7,933,305 B2 | 4/2011 | Ouchi et al. | |
| 8,410,860 B2 * | 4/2013 | Koyama et al. | 331/107 SL |
| 8,451,069 B2 | 5/2013 | Sekiguchi et al. | |
| 8,779,864 B2 * | 7/2014 | Ouchi et al. | 331/115 |
| 2007/0279136 A1 * | 12/2007 | Koyama et al. | 331/107 T |
| 2011/0089516 A1 | 4/2011 | Sekiguchi | |
| 2011/0248724 A1 | 10/2011 | Sekiguchi | |
| 2012/0068778 A1 | 3/2012 | Sekiguchi | |
| 2012/0105161 A1 | 5/2012 | Ouchi et al. | |
| 2012/0119838 A1 | 5/2012 | Koyama et al. | |

FOREIGN PATENT DOCUMENTS

| | | |
|---|---|---|
| JP | 2011-61274 | 3/2011 |
| JP | 2012-90255 | 5/2012 |

OTHER PUBLICATIONS

M. Reddy, et al., "Monolithic Schottky-Collector Resonant Tunnel Diode Oscillator Arrays to 650 GHz", IEEE Electron Device Letters, vol. 18, No. 5, pp. 218-221, May 1997.

* cited by examiner

*Primary Examiner* — Joseph Chang
(74) *Attorney, Agent, or Firm* — Fitzpatrick, Cella, Harper & Scinto

(57) ABSTRACT

An oscillator configured to oscillate an electromagnetic wave, including: a negative resistance device; a microstrip resonator configured to determine an oscillation frequency of an electromagnetic wave excited by the negative resistance device; a resistance device and a capacitance device, which form a low-impedance circuit configured to suppress parasitic oscillation; and a strip conductor configured to connect the capacitance device of the low-impedance circuit and the microstrip resonator to each other, in which an inductance L of the strip conductor and a capacitance C of the microstrip resonator produce a resonance frequency of $1/2\pi\sqrt{LC}$, and $1/4$ of an equivalent wavelength of the resonance frequency is larger than a distance between the negative resistance device and the resistance device of the low-impedance circuit via the strip conductor, is provided.

12 Claims, 4 Drawing Sheets

OSCILLATOR

BACKGROUND OF THE INVENTION

1. Field of the Invention

The present invention relates to an oscillator using a negative resistance device, and more particularly, to an electromagnetic-wave oscillator for a frequency band in a range of, for example, from a millimeter band to a terahertz band (30 GHz or higher and 30 THz or lower; the same applies hereinafter).

2. Description of the Related Art

As is widely recognized, a negative resistance device, together with a resonator, is useful in application fields of oscillators for electromagnetic waves. It has heretofore been known to generate an electromagnetic wave containing at least a part of frequency components in a frequency band in a range of from a millimeter band to a terahertz band (hereinafter also simply referred to as "terahertz wave and the like"). As an example, IEEE Electron Device Letters, Vol 18, 218 (1997) discloses an oscillator in which a negative resistance device is monolithically integrated on a substrate. A slot antenna is integrated on the semiconductor substrate having the negative resistance device, and a resonator structure and a gain medium are monolithically formed.

FIG. 6 is a diagram illustrating the oscillator disclosed in this document. This oscillator uses, as a negative resistance device, a resonant tunneling diode S-RTD 11 provided with a Schottky barrier on the collector side. As a resonator, a slot antenna is used. The slot antenna disclosed in this document is formed of a metal pattern 12 on a semiconductor substrate, and it includes capacitors 13 and 14 at both ends of the slot antenna. The oscillator disclosed in this document further includes a rectifier diode 15. The rectifier diode 15 forms a stabilizing circuit for suppressing parasitic oscillation, which can be problematic in an oscillator using a negative resistance device. Parasitic oscillation refers to oscillation that is parasitically generated in a frequency band on the low frequency side different from a desired frequency. Such parasitic oscillation greatly decreases an oscillation output at a desired frequency, and it is therefore very important to provide the stabilizing circuit in the oscillator using the negative resistance device, as described in detail below. When the oscillator has an oscillation wavelength $\lambda_{osc}$ and an oscillation frequency $\omega_{osc}$, in order to suppress parasitic oscillation, the power source for supplying bias needs to be low in impedance in a frequency region of DC or higher and lower than $\omega_{osc}$. One possible solution is to dispose a low-impedance circuit (such as a shunt rectifier diode) at a position within $\lambda_{osc}/4$ from the S-RTD on the power source side. Therefore, in FIG. 6, the rectifier diode 15 is integrated as a low-impedance circuit at a position within $\lambda_{osc}/4$ from the S-RTD 11 on a power source 16 side. This oscillator includes a resistor 17 as the sum of an internal resistance of the power source 16 and a resistance of connection lines.

However, IEEE Electron Device Letters, Vol 18, 218 (1997) merely describes a circuit configuration of the oscillator including the slot resonator using the slot antenna. This circuit configuration could not be applied to a microstrip resonator, such as a patch antenna. Specifically, the position within $\lambda_{osc}/4$ from the negative resistance device such as an RTD on the power source side corresponds to a region of the patch itself or a region that is more affected by a resonance magnetic field in the periphery of the patch. Thus, it has not been easy to dispose a low-impedance circuit.

SUMMARY OF THE INVENTION

The present invention has been made in view of the above-mentioned problem, and it is an object thereof to propose a circuit configuration capable of suppressing, in a microstrip resonator such as a patch antenna, parasitic oscillation in a frequency region of DC or higher and lower than an oscillation frequency $\omega_{osc}$ thereof.

In one aspect of the present invention, an oscillator configured to oscillate an electromagnetic wave, including: a negative resistance device; a microstrip resonator configured to determine an oscillation frequency of an electromagnetic wave excited by the negative resistance device; a resistance device and a capacitance device, which form a low-impedance circuit configured to suppress parasitic oscillation; and a strip conductor configured to connect the capacitance device of the low-impedance circuit and the microstrip resonator to each other, in which an inductance L of the strip conductor and a capacitance C of the microstrip resonator produce a resonance frequency of $1/2\pi\sqrt{LC}$, and ¼ of an equivalent wavelength of the resonance frequency is larger than a distance between the negative resistance device and the resistance device of the low-impedance circuit via the strip conductor, is provided.

According to the exemplary embodiment of the present invention, a low-impedance circuit for suppressing parasitic oscillation can be disposed at any position in a microstrip resonator at which the influence of a resonance magnetic field is suppressed. The parasitic oscillation, which is a problem in a negative resistance device involving a microstrip resonator, can be suppressed consequently.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

According to the present invention, a negative resistance device involving a microstrip resonator and a capacitance device forming a low-impedance circuit are connected to each other by a strip conductor. An inductance L of the strip conductor and a capacitance C of the microstrip resonator (capacitance C between the microstrip resonator and its ground electrode) produce a resonance frequency of $1/2\pi\sqrt{LC}$ ($\omega_{LC}=1/\sqrt{LC}$), and ¼ of an equivalent wavelength $\lambda_{LC}$ ($=\omega_{LC}/2\pi$) thereof is larger than a distance "d" between the negative resistance device and a resistance device forming the low-impedance circuit via the strip conductor. This structure enables the low-impedance circuit to be disposed at any position in the microstrip resonator at which the influence of a magnetic field is suppressed.

Referring to the accompanying drawings, an embodiment of the present invention is described below.

(First Embodiment)

Figure 1:
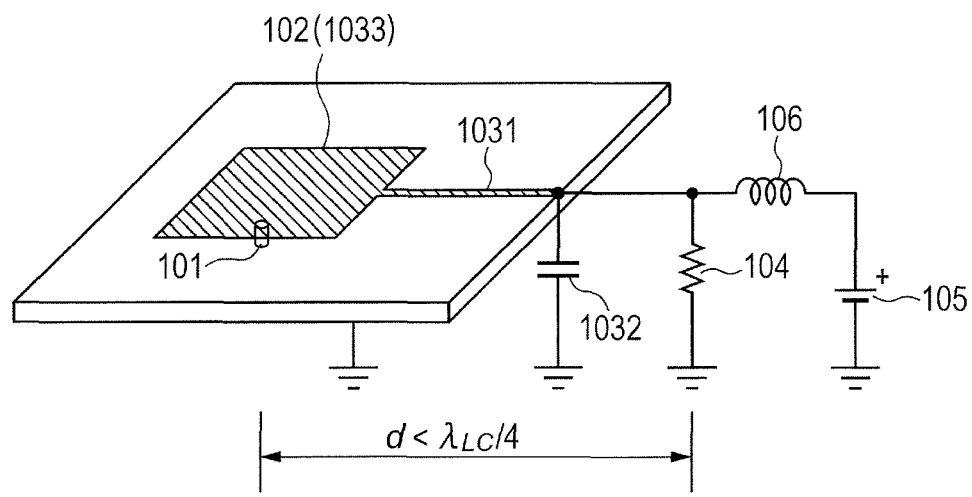
FIG. 1 is a diagram illustrating a configuration of an oscillator according to a first embodiment of the present invention.
Figure 2:
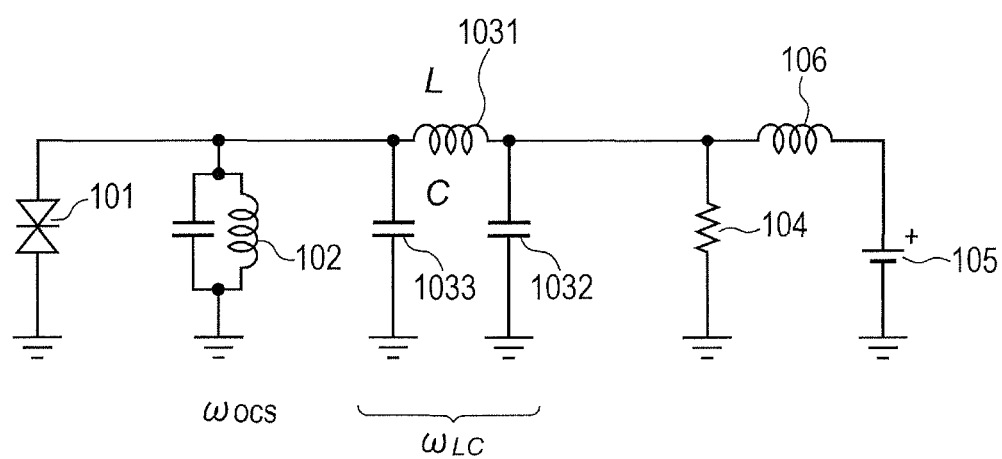
FIG. 2 is a diagram illustrating an equivalent circuit of the configuration of the oscillator according to the first embodiment of the present invention.

An oscillator according to a first embodiment of the present invention is now described with reference to FIGS. 1 and 2. FIG. 1 is a schematic diagram illustrating the oscillator of this embodiment. FIG. 2 is a circuit diagram illustrating the oscillator of this embodiment. In this embodiment, a resonant tunneling diode (RTD), an Esaki diode, or a Gunn diode is typically selected as a negative resistance device 101. Otherwise, a transistor having one terminated lead may be used. A resonator 102 for defining an oscillation frequency of an electromagnetic wave excited by the negative resistance device is a microstrip resonator using a patch antenna or a microstrip line with a finite length. The microstrip resonator refers to a resonator including an electrically floating conductive layer such as a metal plate connected to the ground. In FIG. 2 illustrating a corresponding equivalent circuit, devices are discriminated between the resonance circuit 102 for an oscillation frequency $\omega_{osc}$ and a capacitance C (1033) for a lower frequency region. A bias circuit includes a power source 105 and a wiring 106. The wiring always has a parasitic inductance component 106, and it is therefore represented as inductance in the equivalent circuit of FIG. 2.

The power source 105 supplies a current necessary for driving the negative resistance device 101, and it adjusts an operating point voltage. The operating point is typically selected from a negative resistance region. In this embodiment, a low-impedance circuit for preventing parasitic oscillation with respect to the oscillation at the oscillation frequency $\omega_{osc}$ is formed of a resistor 104 and a decoupling capacitor (bypass capacitor) 1032 connected in parallel to the resistor 104. Those devices are used to realize low impedance in each frequency region for which parasitic oscillation is to be prevented. When the oscillation frequency $\omega_{osc}$ of the resonator 102 is in a terahertz band, the resistor 104 has an operation region from DC to the millimeter wave band, and the capacitor 1032 has an operation region of the terahertz band, for example. The value of the resistor 104 is selected as a value equal to or slightly smaller than the absolute value of a negative resistance of the negative resistance device 101 in the negative resistance region. The device for realizing low impedance may be a capacitance device. Regardless of whether the device is a capacitance device or a resistor, the device can be regarded as forming a low-impedance circuit as long as the impedance of the device is lower than the absolute value of the negative resistance of the negative resistance device 101.

A microstrip line 1031 has a role of supplying bias to the negative resistance device 101 from the bias circuits 105 and 106. The microstrip line 1031 acts as an inductance L in a frequency region of the oscillation frequency or lower, and it is therefore represented by symbol of the inductance in the equivalent circuit of FIG. 2. The decoupling capacitor 1032 is connected to the microstrip line 1031. For example, a metal-insulator-metal (MIM) structure may be used, in which the patch and the substrate are integrated. In this embodiment, the value of the capacitor 1032 may be set to be 1 pF or larger (the order of $>1/\omega_{THz}$) in order that the capacitor 1032 have an operation region of only the terahertz band ($\omega_{THz}$) as a component of the low-impedance circuit. In general, it is preferred that the value of the capacitor 1032 be large.

This structure enables the resistance device 104 forming the low-impedance circuit to be disposed at any appropriate position extended from the resonator 102 because of the presence of the strip conductor (inductance L) 1031. On the other hand, the strip conductor 1031 forms a resonance circuit having an LC resonance frequency $\omega_{LC}$ together with the capacitor 1033 of the microstrip resonator such as a patch antenna via the decoupling capacitor 1032. In general, there is a trade-off relationship between "the arrangement of the resistance device 104 at any position" and "the formation of the resonance circuit having the LC resonance frequency." However, by forming the LC resonance circuit as follow, the oscillation can be disabled or suppressed.

That is, the inductance L is sufficiently increased so that the LC resonance frequency is sufficiently decreased. For example, by decreasing the LC resonance frequency to a frequency band for the resistor 104, the oscillation can be disabled or suppressed. When the resistor 104 is disposed at a position within $\lambda_{LC}/4$ from the negative resistance device 101 on the power source side, the resistor 104 acts as a low-impedance device in an electromagnetic wave band including $\lambda_{LC}$. Utilizing this action, a design is made so that ¼ of the equivalent wavelength $\lambda_{LC}$ of the LC resonance frequency may be larger than a distance "d" between the negative resistance device 101 and the resistance device 104 forming the low-impedance circuit, to thereby disable or suppress the oscillation of the LC resonance circuit. Consequently, parasitic oscillation is not generated (or suppressed) in a frequency region of DC or higher and lower than $\omega_{osc}$ even in a microstrip resonator such as a patch resonator, and an oscillation output of a desired oscillation frequency can be obtained from the resonator.

This structure enables the low-impedance circuit to be disposed at any position in the microstrip resonator at which the influence of a magnetic field is suppressed, thereby suppressing an additional parasitic oscillation to be generated by the inductance of the strip conductor. Thus, a desired oscillation frequency can be obtained in the microstrip resonator.

More specific oscillators are described by way of the following examples.

EXAMPLE 1

Figure 3A:
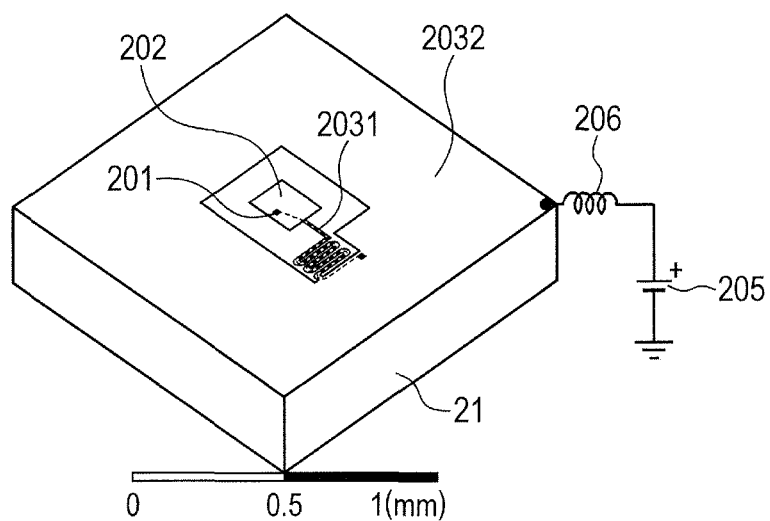
FIGS. 3A and 3B are diagrams illustrating a configuration of an oscillator according to Example 1 of the present invention.
Figure 3B:
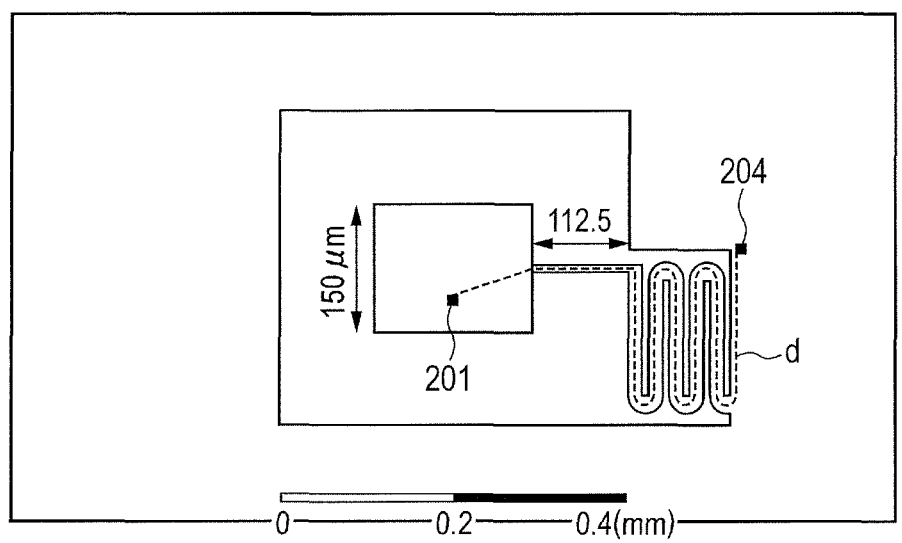

An oscillator according to Example 1 of the present invention is now described with reference to FIGS. 3A and 3B. FIG. 3A is a perspective view illustrating the oscillator of Example 1. FIG. 3B is a top view illustrating metal patterning in the vicinity of a patch antenna. In Example 1, a resonant tunneling diode (RTD) is used as a negative resistance device.

FIGS. 3A and 3B illustrate the patch antenna formed of metal patterning for electromagnetic wave oscillation and its peripheral circuit structure. The patch antenna of Example 1 is an oscillator for oscillating at approximately 0.5 THz. An RTD 201 includes, for example, a multiple quantum well structure of InGaAs/InAlAs and InGaAs/AlAs and electrical contact layers of n-InGaAs which are formed on an InP substrate 21. For example, a triple-barrier structure is used as the multiple quantum well structure. More specifically, a semiconductor multi-layer structure of AlAs (1.3 nm)/InGaAs (7.6 nm)/InAlAs (2.6 nm)/InGaAs (5.6 nm)/AlAs (1.3 nm) is used. Of those layers, the InGaAs layer is a well layer, and the lattice-matched InAlAs layer and the lattice-mismatched AlAs layer are barrier layers. Those layers are in an undoped state without intentional carrier doping. Such a multiple quantum well structure is sandwiched by the electrical contact layers of n-InGaAs with an electron density of $2\times10^{18}$ cm$^{-3}$. Current-voltage (I-V) characteristics of the structure between the electrical contact layers have a peak current density of 280 kA/cm$^2$, and a negative resistance region in the range of from approximately 0.7 V to approximately 0.9 V. In the case where the RTD 201 has a mesa structure with a diameter of approximately 2 µm, a peak current of 10 mA and a negative resistance of −20Ω are obtained.

The details of the patterning are illustrated in FIG. 3B. A patch 202 is 150 µm in length on a side in the resonance direction. Taking into account the reactance of the RTD of 2 µm in diameter that is connected to the bottom of the patch 202, the oscillation frequency is approximately 0.5 THz. A microstrip line 2031 connected to the patch 202 extends from the patch 202 by 112.5 µm, and reaches a MIM capacitor 2032 (corresponding to the capacitor 1032 in the circuit of FIG. 2) via a meander shape of approximately 150 µm on its way. The meander shape is folded four times. The use of the meander is preferred because a large inductance is obtained by a relatively small area. The MIM pattern 2032 is separated away from the patch 202 by 112.5 µm so as not to affect a radiation pattern of the patch antenna. The size of the MIM capacitor is 10 pF in Example 1.

In the patterning structure described above, an LC resonance frequency of around 20 GHz is formed by the inductance of the strip conductor of approximately 0.4 nH and the capacitance of the patch antenna of 0.16 pF. The equivalent wavelength of 20 GHz is defined by a waveguide wavelength to be approximately 9.7 mm in Example 1, and hence a resistor 204 is disposed at a distance "d" (<2.4 mm), which is smaller than ¼ of approximately 9.7 mm, from the RTD 201. In Example 1, a resistor that is easily accommodated within 2.4 mm is selected as the resistor 204. The entire length of the strip conductor 2031 is 0.9 mm or less, and hence such a resistor 204 is obtained by embedding a resistor at an internal position of the MIM structure at the distance "d" (<2.4 mm) from the RTD via the strip conductor. The resistor 204 has a MIM structure in which an upper electrode and a lower electrode are connected to each other at 20Ω, for example. In this structure, a magnetic field of 20 GHz leaks from the strip conductor 2031 to the MIM structure to reach the resistor 204, and hence the resistor 204 acts effectively as a low-impedance circuit device. Consequently, the oscillation at the LC resonance frequency is suppressed. In this way, an oscillation output is obtained only at a desired oscillation frequency of 0.5 THz, and, because the RTD 201 and the resistor 204 are distant from each other, there is another effect that the influence of Joule heat generation of the resistor 204 on the RTD 201 can be relatively reduced. Thus, continuous wave (CW) oscillation can be performed as well.

The oscillation device of Example 1 can be manufactured by the following manufacturing method. First, the following layers are epitaxially grown on the InP substrate 21 by molecular beam epitaxy (MBE), metalorganic vapor phase epitaxy (MOVPE), or the like. Specifically, an n-InP/n-InGaAs layer and an InGaAs/InAlAs layer are epitaxially grown in this order to form the resonant tunneling diode 201. In the case where an n-type conductive substrate is selected as the InP substrate 21, the resonant tunneling diode may be epitaxially grown from an n-InGaAs layer. Next, the resonant tunneling diode 201 is etched into a circular mesa shape. Then, the resonant tunneling diode 201 is further etched into an arc mesa shape with a diameter of 2 µm. For etching, dry etching using electron beam (EB) lithography and inductive coupling plasma (ICP) is used. Photolithography may be used instead. Subsequently, a ground metal is formed on the etched surface by lift-off. A passivation film may be formed to protect the side wall of the resonant tunneling diode. Then, an insulator is embedded, and Ti/Pd/Au patterns 202, 2031, and 2032 are formed by lift-off. Finally, a bismuth pattern is formed by lift-off in a region to be the resistor 204, and the Ti/Pd/Au pattern 2032 is connected to the ground metal via the formed bismuth through-hole. This completes the oscillation device of Example 1.

Electric power is supplied to the oscillation device appropriately from bias circuits 205 and 206 via the strip conductor 2031 disposed at the center of the patch 202. Normally, when a bias current is supplied through the application of a bias voltage in the negative resistance region, the oscillation device operates as an oscillator.

EXAMPLE 2

Figure 4A:
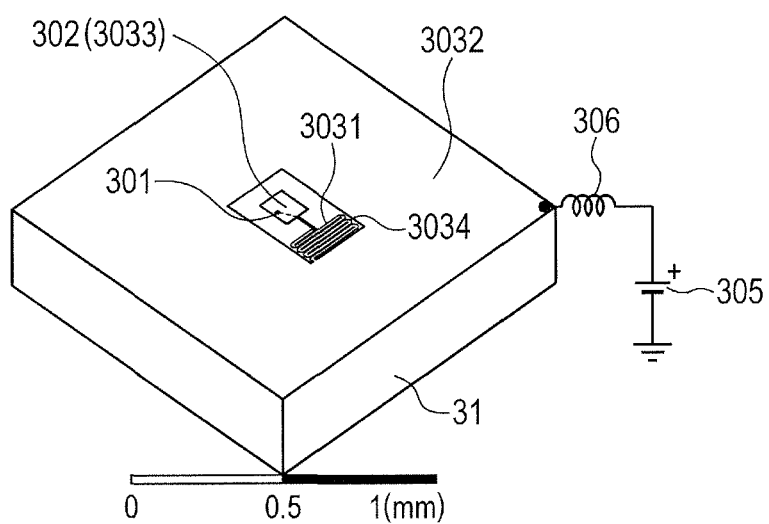
FIGS. 4A and 4B are diagrams illustrating a configuration of an oscillator according to Example 2 of the present invention.
Figure 4B:
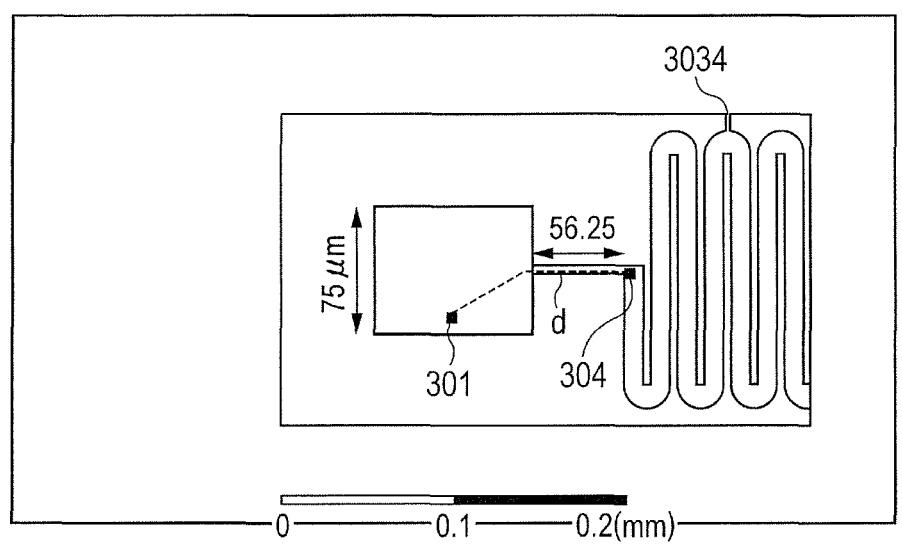

An oscillator according to Example 2 of the present invention is now described with reference to FIGS. 4A and 4B. FIGS. 4A and 4B are diagrams illustrating an oscillator according to a modified example of Example 1, exemplifying the case where a resonant tunneling diode is used as a negative resistance device also in Example 2 and the oscillation frequency is high. FIG. 4A is a perspective view of the oscillator of Example 2. FIG. 4B is a top view illustrating metal patterning in the vicinity of a patch antenna.

The patch antenna of Example 2 is an oscillator for oscillating at approximately 0.9 THz. The details of the patterning are illustrated in FIG. 4B. A patch 302 is 75 µm in length on a side in the resonance direction. Taking into account the reactance of the RTD of 2 µm in diameter that is connected to the bottom of the patch 302, the oscillation frequency is approximately 0.9 THz. Even when the length of the side of the resonator is halved, the oscillation frequency is not doubled because of the reactance of the RTD. A microstrip line 3031 extends from the patch 302 by 56.25 µm, and reaches a MIM capacitor 3032 via a meander shape of approximately 150 µm on its way. The meander shape is folded six times. This portion is changed in design to deal with a higher frequency. Specifically, a relatively small capacitor 3033 of the patch is used to prevent the LC resonance frequency from being too high. In Example 2, a high-frequency short-circuit portion 3034 for high-frequency short-circuiting a part of the strip conductor is provided in the middle of the meander 3031. This structure is aimed at disabling or suppressing oscillation at a distributed-constant resonance frequency different from the LC resonance frequency, which is formed by a standing wave in the strip conductor 3031 when the strip conductor 3031 is relatively long.

In the patterning structure described above, an LC resonance frequency formed by the inductance of the strip conductor of approximately 0.5 nH and the capacitance of the patch antenna of approximately 0.04 pF is around 35 GHz. The equivalent wavelength of 35 GHz is approximately 5.4 mm, and hence, in Example 2, a resistor 304 is disposed at a distance "d" (<1.4 mm), which is smaller than ¼ of approximately 5.4 mm, from an RTD 301 on a substrate 31 via the strip conductor. As exemplified in Example 2, the resistor 304 may be embedded in the middle of the strip conductor 3031. When the position of the resistor 304 is as close as possible to the RTD 301, the suppressing effect is more effective. In Example 2, in order not to affect the impedance of the patch antenna in the vicinity of $\omega_{osc}$, the resistance device 304 forming a low-impedance circuit is disposed in the strip conductor at the position separated away from the patch 302 by ¼ of the equivalent wavelength of an oscillation frequency $\omega_{osc}/2\pi$.

From a simulation, it has been revealed that a distributed-constant resonance frequency is present in the vicinity of 150 GHz when the short-circuit portion 3034 is not provided in the middle of the meander 3031. With the high-frequency short-circuit portion 3034 provided, however, the impedance in the vicinity of 150 GHz is decreased, thereby disabling or suppressing oscillation. Consequently, parasitic oscillation is not generated (or suppressed) in a frequency region of DC or higher and lower than $\omega_{osc}$, and an oscillation output can be obtained only at a desired oscillation frequency of 0.9 THz.

Electric power is supplied to the oscillation device appropriately from bias circuits 305 and 306 via the strip conductor 3031 disposed at the center of the patch 302. Normally, when a bias current is supplied through the application of a bias voltage in the negative resistance region, the oscillation device operates as an oscillator.

In the case of a patch having an oscillation frequency of higher than 1 THz, the strip conductor needs to be longer. Therefore, a distributed-constant second resonance frequency may be generated, but the oscillation can be disabled or suppressed by the method of providing a high-frequency short-circuit portion in the middle of the strip conductor.

Figure 5:
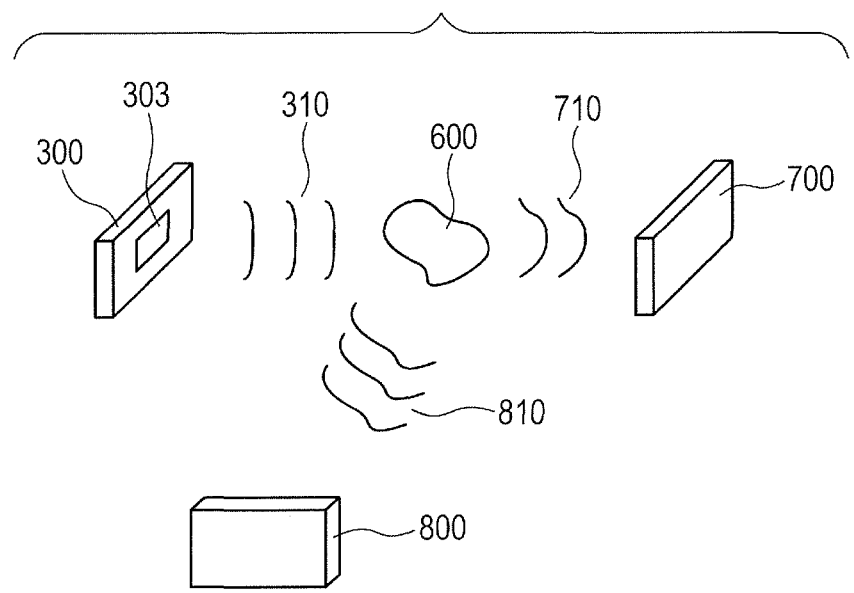
FIG. 5 is a diagram illustrating a measuring apparatus using the oscillator of the present invention.
Figure 6:
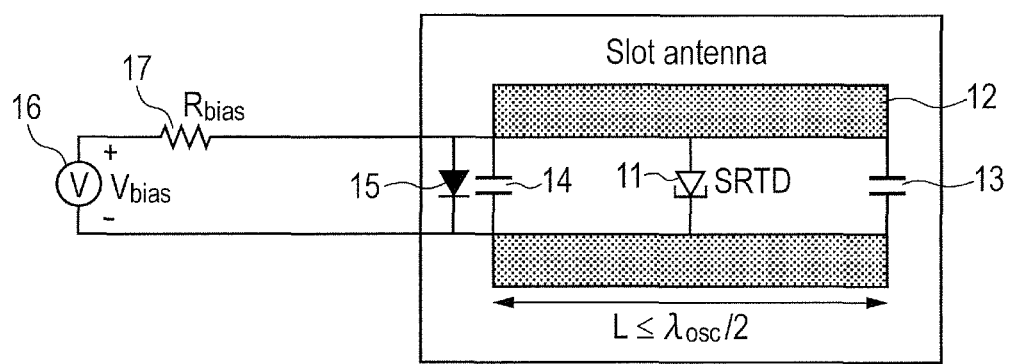
FIG. 6 is a schematic diagram illustrating a configuration of an oscillator disclosed in IEEE Electron Device Letters, Vol 18, 218 (1997).

An apparatus illustrated in FIG. 5 can be provided by using the oscillator described above in combination with an operation section for calculating the state of an object or the like. For example, the oscillator of the present invention is used as an oscillator 300 including a microstrip resonator 303, and an object 600 is disposed at a position to be irradiated with an electromagnetic wave 310, such as a terahertz wave, emitted from the oscillator 300. The object 600 interacts with the electromagnetic wave 310, and hence the oscillated magnetic wave receives some influence. The electromagnetic wave radiated to the object 600 is reflected or transmitted. A resultant transmitted wave or reflected wave 710 or 810 is detected by a detector 700 or 800. After that, the operation section, such as a personal computer, calculates information on the object 600 (state and the like) based on the detected signal. Specifically, a possible application of this apparatus is an industrial test device for examining the state of a drug. In this way, the measuring apparatus configured so that an electromagnetic wave from the object irradiated with the electromagnetic wave emitted from the oscillator is detected by a receiver. In this case, the oscillator 300 corresponds to the oscillator of the present invention, and the electromagnetic wave that interacts with the object is detected and information on the object is obtained based on the detected signal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-128509, filed Jun. 6, 2012, and Japanese Patent Application No. 2013-097617, filed May 7, 2013, which are hereby incorporated by reference herein in their entirety.

What is claimed is:

1. An oscillator configured to oscillate an electromagnetic wave, comprising:
    a negative resistance device;
    a microstrip resonator configured to determine an oscillation frequency of an electromagnetic wave excited by the negative resistance device;
    a resistance device and a capacitance device, which form a low-impedance circuit configured to suppress parasitic oscillation; and
    a strip conductor configured to connect the capacitance device of the low-impedance circuit and the microstrip resonator to each other,
    wherein an inductance L of the strip conductor and a capacitance C of the microstrip resonator produce a resonance frequency of $1/2\pi\sqrt{LC}$, and ¼ of an equivalent wavelength of the resonance frequency is larger than a distance between the negative resistance device and the resistance device of the low-impedance circuit via the strip conductor.

2. The oscillator according to claim 1, further comprising a bias circuit that comprises a power source and a wiring, the power source being configured to adjust an operating point voltage of the negative resistance device.

3. The oscillator according to claim 1, wherein the strip conductor includes a part having a meander shape.

4. The oscillator according to claim 1, wherein the strip conductor is short-circuited in part.

5. The oscillator according to claim 1, wherein the microstrip resonator comprises a patch antenna.

6. A measuring apparatus configured to measure information on an object, comprising:
    the oscillator according to claim 1 configured to emit an electromagnetic wave; and
    a receiver configured to detect the electromagnetic wave from the object.

7. The oscillator according to claim 4, further comprising a short-circuit portion which connects the middle of the strip conductor and the capacitor.

8. The oscillator according to claim 7, wherein the short-circuit portion is made so that oscillation at a distributed-constant resonance frequency different from the resonance frequency is disabled or suppressed.

9. The oscillator according to claim 1, wherein the capacitance device has a MIM structure, and
    the resistance device is embedded at an internal position of the MIM structure.

10. The oscillator according to claim 1, wherein the resistance device is connected at the middle of the strip conductor.

11. The oscillator according to claim 10, wherein the resistance device is disposed between the capacitance device and the microstrip resonator.

12. The oscillator according to claim 1, wherein the low-impedance circuit is made so that the whole parasitic oscillation is suppressed in a frequency region of DC or higher and lower than a desired oscillation frequency of the microstrip resonator.

* * * * *